(12) United States Patent
Furukawa et al.

(10) Patent No.: US 7,528,494 B2
(45) Date of Patent: May 5, 2009

(54) ACCESSIBLE CHIP STACK AND PROCESS OF MANUFACTURING THEREOF

(75) Inventors: Toshiharu Furukawa, Essex Junction, VT (US); Mark C. Hakey, Fairfax, VT (US); Steven J. Holmes, Guilderland, NY (US); David V. Horak, Essex Junction, VT (US); Charles W. Koburger, III, Delmar, NY (US)

(73) Assignee: International Business Machines Corporation, Armonk, NY (US)

( * ) Notice: Subject to any disclaimer, the term of this patent is extended or adjusted under 35 U.S.C. 154(b) by 460 days.

(21) Appl. No.: 11/266,456

(22) Filed: Nov. 3, 2005

(65) Prior Publication Data

US 2007/0096263 A1 May 3, 2007

(51) Int. Cl.
*H01L 23/48* (2006.01)
*H01L 23/52* (2006.01)
*H01L 29/40* (2006.01)
*H01L 21/00* (2006.01)
*H01L 21/4763* (2006.01)

(52) U.S. Cl. ................... 257/777; 438/6; 438/618; 257/E25.013; 257/E25.178

(58) Field of Classification Search ............... 257/700, 257/374, 777, E25.013, E25.178; 438/6, 438/618
See application file for complete search history.

(56) References Cited

U.S. PATENT DOCUMENTS

| 5,552,633 | A | * | 9/1996 | Sharma | ................. 257/700 |
| 6,355,501 | B1 | | 3/2002 | Fung et al. | |
| 6,465,892 | B1 | | 10/2002 | Suga | |
| 6,472,293 | B1 | | 10/2002 | Suga | |
| 6,645,832 | B2 | | 11/2003 | Kim et al. | |
| 7,301,207 | B2 | * | 11/2007 | Kim et al. | .................. 257/374 |

* cited by examiner

*Primary Examiner*—Davienne Monbleau
*Assistant Examiner*—Monica D Harrison
(74) *Attorney, Agent, or Firm*—Scully, Scott, Murphy & Presser, P.C.; Joseph Petrokaitis, Esq.

(57) ABSTRACT

A process of manufacturing a three-dimensional integrated circuit chip or wafer assembly and, more particularly, a processing of chips while arranged on a wafer prior to orienting the chips into stacks. Also disclosed is the manufacture of the three-dimensional integrated circuit wherein the chip density can be very high and processed while the wafers are still intact and generally of planar constructions.

16 Claims, 5 Drawing Sheets

ACCESSIBLE CHIP STACK AND PROCESS OF MANUFACTURING THEREOF

BACKGROUND OF THE INVENTION

1. Field of the Invention

The present invention relates to a process of manufacturing a three-dimensional integrated circuit chip or wafer assembly and, more particularly, relates to the processing of chips while arranged on a wafer prior to orienting the chips into stacks. Furthermore, the invention also pertains to the manufacture of the three-dimensional integrated circuit wherein the chip density can be very high and processed while the wafers are still intact and generally of planar constructions.

In essence, the basic concept of forming three-dimensional or stacked integrated circuits is well known in the semiconductor and related technology, in which the use and fabrication of multi-chip stacks are widely employed in enabling multiple and diverse technologies, and materials can be readily combined into a single system in order to provide functions which are incapable of being obtained by means of single technology and material combinations. Moreover, advantageous and versatile combinations of diverse integrated circuit structures or arrays and modules provided on chips which are assembled in multi-chip stacks can be readily obtained with the shortest leads or wires connecting the various chips, thereby resulting in a shortening of the wiring lengths while concurrently reducing the overall package area in forming the multi-chip stack. It is also possible to produce very large sized chips in the assembling of a plurality of smaller sized chips which are combined and bonded with each other, thereby increasing output of the electronic device employing the chip stacks. In some instances, the three-dimensional integrated chip structures, which are obtained through the formation of multi-chip stacks and the bonding of pluralities of smaller chips to each other in a three-dimensional stack-forming arrangement, can combine diverse technologies. This combination of technologies can enable the obtaining of advantages, such as particle-travel mapping or three-dimensional sensor. Consequently, chip stacks are often utilized in the form of so-called cubes, such as those manufactured by Irvine Sensors™ in which leads are extended outwardly from between bonded chips to a stack edge in order to afford accessibility thereto upon mounting of the chips, for example in a vertical chip array, on an underlying substrate. This, typically, requires special single chip processing on cube edges after effectuating cube stacking with fewer contact leads being accessible, and a necessity for implementing unusual packaging.

Smaller chips can be wire-bonded, while in a face-up orientation onto a larger chip. This hybrid combination, in turn, is then wirebonded to an outside carrier or C4 (controlled collapse chip connection) bonded onto special substrates, which are equipped with recesses in order to accept the so-called bump that normally is present in an attachment. Consequently, this basically-evident combination is limited to either one small or to a few very small-sized chips, which is or are bonded to a considerably larger chip, such that a significant proportion or percentage of the base wafer surface area remains available for connections of the latter to the electronic or semiconductor device package. This, in effect, forms a limitation which restricts the relative sizes and quantities of chips being formed or assembled into multi-chip stacks.

2. Discussion of the Prior Art

Although, various three-dimensional chip and wafer systems and assembling processes have been developed in the current-state-of-the-art, pertaining to this technology, these are still subject to various limitations and restrictions in comparison with the broader aspects attained by means of the present invention.

Suga, U.S. Pat. No. 6,465,892 B1 and Suga, U.S. Pat. No. 6,472,293 B2, which is a divisional of U.S. Pat. No. 6,465,892 B1, each relate to interconnect structure for stacked semiconductor devices and disclose a method of manufacture of the interconnect structures, wherein the basic concept in each of the patents resides in efforts of shortening the wiring length by superimposing semiconductor substrates and bonding these together by means of solid state bonding techniques. Although this provides for the stacking of chips, there is no formation of a multi-chip stack in a manufacturing process utilizing a flat wafer structure, whereby prior to forming and bonding the chips into stacks, all of the chips processing is precedingly performed.

Concerning Fung, et al., U.S. Pat. No. 6,355,501 B1, which relates to a three-dimensional chip stacking assembly, and which is commonly assigned to the assignee of the present application, this pertains to the forming of three-dimensional stacked SOI (silicon-on-insulator) structures. However, although this patent is directed to a method of stacking ultra thin chips with interconnections for maximizing the operational speed of an integrated circuit package, there is no disclosure of a process of fabrication and processing of all of the chips while mounted on a standard wafer prior to separation or slicing of the wafer into individual components prior to chip stacking.

SUMMARY OF THE INVENTION

Accordingly, in order to clearly and uniquely improve upon the prior art, as represented by the current technology, the present invention is directed to the provision of a process in which a manufacture is implemented in processing the chips while arrayed on flat planar wafers prior to separating and forming or bonding the chips superimposingly into multi-chip stacks.

In effect, the access to wiring for the integrated circuits or semiconductor devices is provided through upper chips towards chips positioned therebelow, so as to be adhesively bonded together and whereby usual planar wafer design, bonding, dicing and handling can be implemented, and in which the upper chips commence with SOI or the like technologies so as to be readily capable of being thinned, as necessary. This particular thinning process effectively affords that any through-vias in the chip can be of reasonable dimensions and are built or formed while the wafers are still intact and planer in surface configuration. This can facilitate an extremely high chip density being provided on the wafer surface, so as to thereby maximize the yield of processed chips and resultant increase in output upon forming of the multi-chip stacks through the superposition and bonding together of the chips.

Accordingly, it is an object of the present invention to provide a process for the manufacture of multi-chip stacks, which will afford the processing of the chips while arranged on a wafer substrate prior to the chips being aligned into multi-chip stacks.

Another object of the present invention resides in processing pluralities of chips while mounted on a wafer so as to enable access to wiring extending from upper chips to lower chips of a multi-chip stack formed from the chips in order to facilitate the utilization of a planar wafer design, bonding, wafer dicing and handling of the separated chips.

BRIEF DESCRIPTION OF THE DRAWINGS

Reference may now be made to the following detailed description of preferred embodiments of multi-chip stacks formed pursuant to the invention, taken in conjunction with the accompanying drawings; in which.

DETAILED DESCRIPTION OF THE INVENTION

Figure 1:
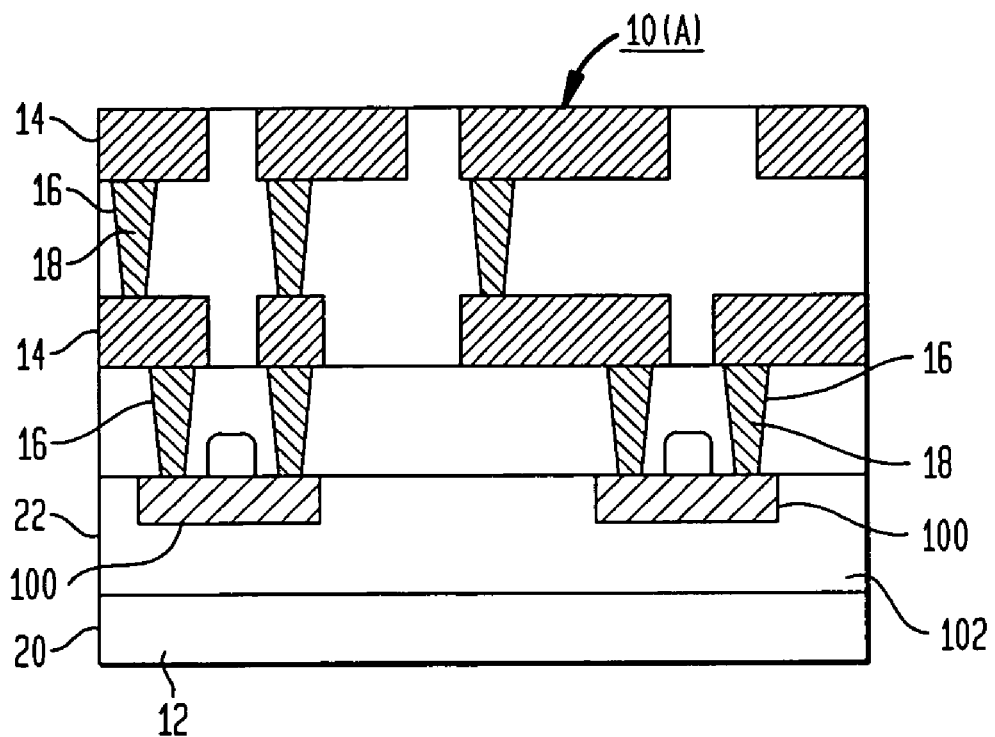
FIG. 1 illustrates a first base semiconductor Chip (A), which is utilized in the manufacture of the multi-chip stack pursuant to the invention.

Referring in specific detail to the drawings, as shown in FIG. 1, there is provided a first base semiconductor Chip 10 (identified as A), which is arranged on a substrate, such as a planar wafer 12, and is provided with a plurality of metal levels 14, of which only two are illustrated in this particular embodiment, although additional levels and layers may be readily provided for multiple-level technologies. Also provided in base semiconductor Chip 10 are, for example, active devices including Field Effect Transistor (FET) gate electrodes 100 and active SOI regions 102.

This particular chip structure is in a wafer form, and includes interconnecting passages and vias 16 filled with electrically conductive material 18, as may be required by a specific technology. The chip is mounted on a handle 20 constituting a handling layer below a Buried Oxide ("BOX") and Shallow Trench Isolation ("STI") layer 22, and will remain permanently thereon. Hereby, the chip can be bulk, Si, SOI, SiGe, GaAs, or any suitable construction, as known in the technology.

Figure 2:
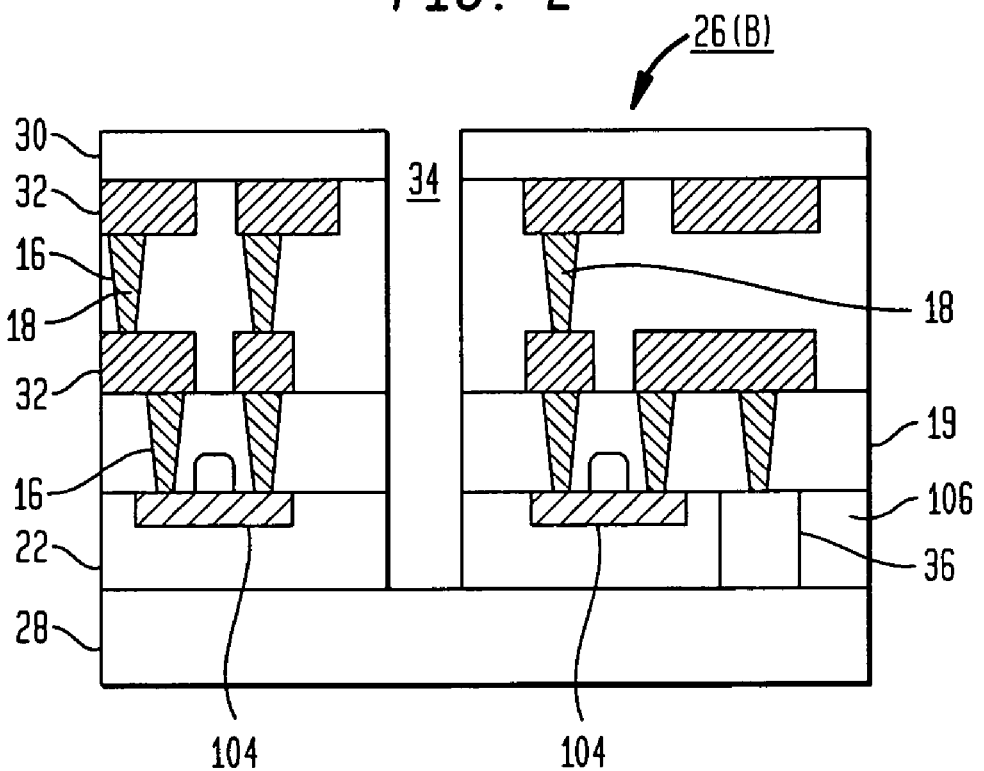
FIG. 2 illustrates a second semiconductor Chip (B), which is adapted to be bonded to the base semiconductor Chip A shown in FIG. 1.

As illustrated in FIG. 2 of the drawings, there is provided a second Chip 26, (identified as B), which may be constituted of an SOI, or any suitable material of that type from which a handle wafer 28 can be readily removed. At the opposite side from the handle wafer or layer 28, the second Chip 26 is provided with a capping layer (or layers) 30.

As in the preceding Chip A of FIG. 1, any number of metal levels 32 may be utilized in Chip B, depending upon the types of technologies and connections required from the integrated circuit, although in this instance, only two metal levels 32 are illustrated by way of example. Also, as in the preceding Chip A, provided in base semiconductor Chip 26 are, for example, active devices including Field Effect Transistor (FET) gate electrodes 104 and active SOI regions 106. The Chip 26 may be subjected to a near-final test in order to be able to identify a good die and then the wafer capped through capping layers or films 30 with dielectric, and printed and etched with a through-via 34, which penetrates through capping layers or films 30, and through Inter-Level Dielectrics (ILDs) 19 and BOX (buried oxide layers) 22, stopping on or in the handle wafer or layer 28. These through-vias 34 are not yet filled, and are subsequently employed in order to contact Chip A.

At possibly frequent times, if necessary, any electrical contact (not shown) to Chip B may be implemented from what in FIG. 2 is the bottom thereof. Shapes 36 comprised of contact features penetrating completely through BOX and STI layers 22 to handle wafers 28 are employed, as shown in the drawing FIG. 2, to accomplish this particular manufacturing step. Thereafter, the Chip or Chips B's is or are diced and collected into dies which have been ascertained as being acceptable.

Figure 3:
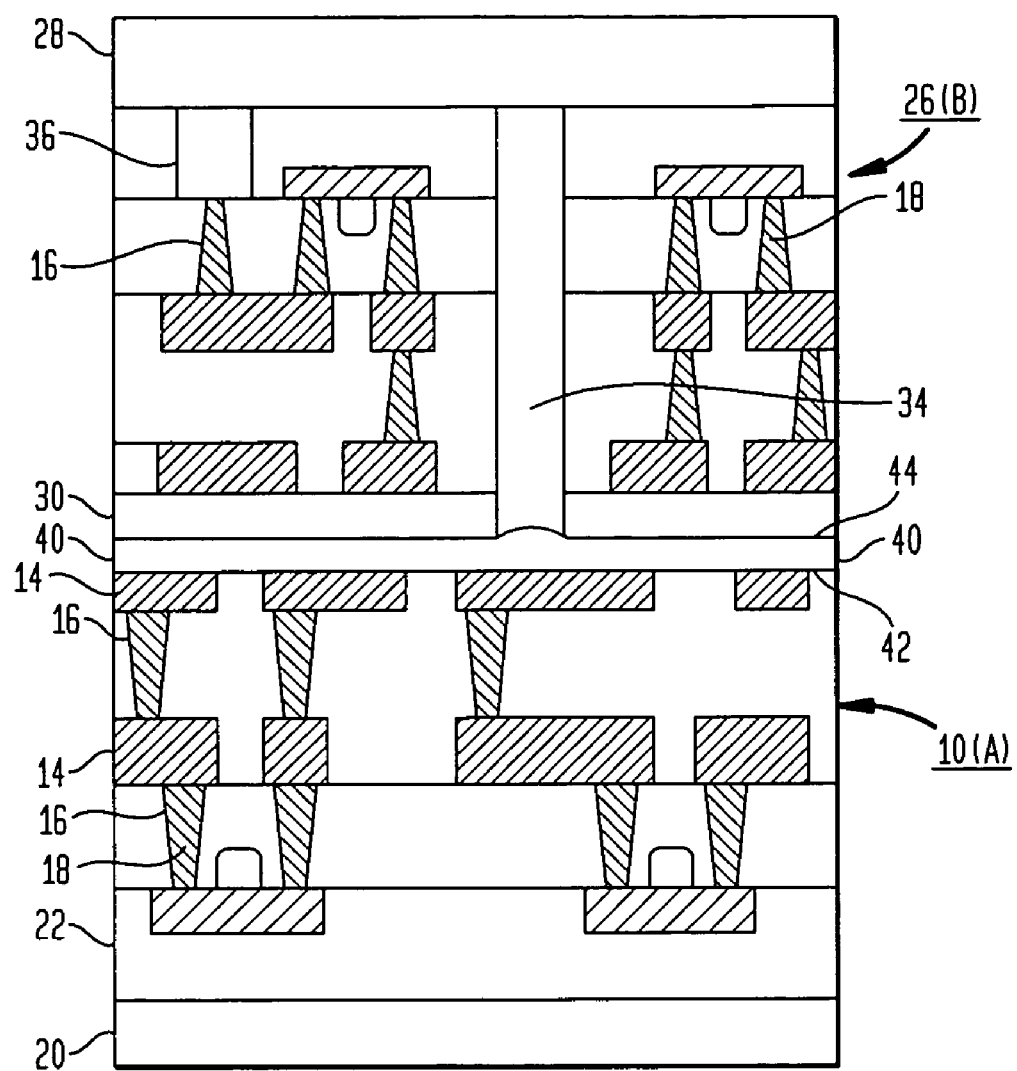
FIG. 3 illustrates the semiconductor chips A and B of FIGS. 1 and 2 in a mutually aligned and bonded relationship implemented during the multi-chip stack manufacturing process pursuant to the invention.

As illustrated in the assembling of chips 10 and 26, i.e., chips A and B as in FIG. 3 of the drawings, Chip B is inverted and an adhesive 40 is applied to the facing surfaces 42, 44 of the wafer or Chip A and/or Chip B. The accepted Chip 26 (i.e., Chip B) is flipped over and aligned and bonded by means of the adhesive 40 to the previously tested and accepted wafer or Chip 10 (i.e., Chip A). The bonding adhesive may, for example, be constituted of a maleic anhydride polymer, which is activated by using a dendritic amine binder, and it is recommended that the bond between the chips formed through the adhesive be maintained as thin as possible so as not to result in any outgassing phenomenon or in any significant change in the volume of the stacked superimposed adhesively bonded chips 10, 26 (i.e., Chips A and B). It is possible to attain a final thickness of 5 to 10 nm if the bonded surfaces are sufficiently flat and clean, thereby reducing the amount of adhesive required to a minimum thickness.

Figure 4:
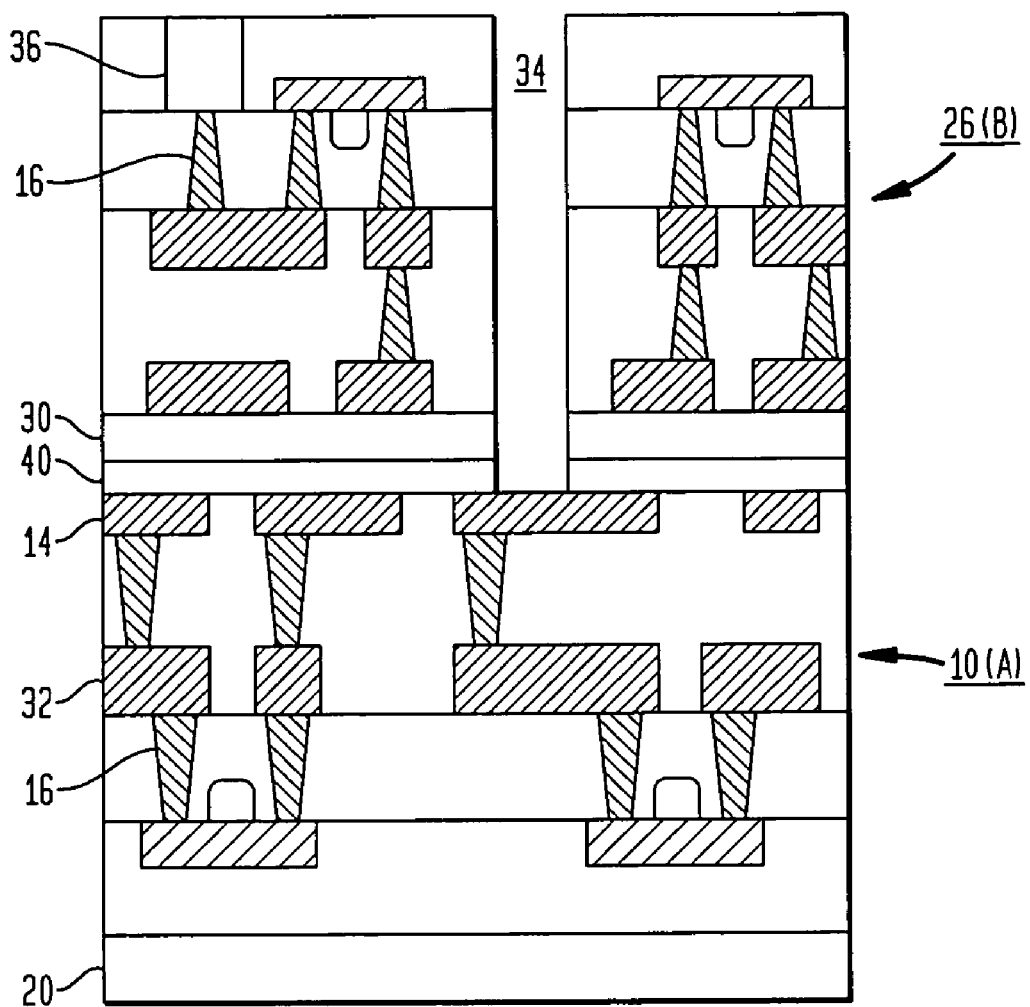
FIG. 4 illustrates the semiconductor chips of FIG. 3 in which further processing steps have been implemented.

As illustrated in FIG. 4 of the drawings, the wafer substrate comprising the handle layer 28 is removed from Chip 26 (i.e., Chip B), and in the event that handle layer 28 is constituted of silicon, it is possible to implement this removal process by means of KOH solution. Similarly, if the shape 36 contact features in Chip B are also constituted of silicon, then the employment of KOH will etch this material out, but this may not be necessary or essential unless they are to be refilled with the same material used to fill the through-via 34. The removal of the handle wafer or layer 28 exposes the still unfilled through-via 34, which has been formed in Chip 26. Thereafter, etching may be implemented utilizing the still open through-via 34 as a mask in order to remove capping layers or films 30 and adhesive 40, which are present below the through-via 34 and above the appropriate metal pads 14; whereby the etching may stop on the metal pads 14.

Figure 5:
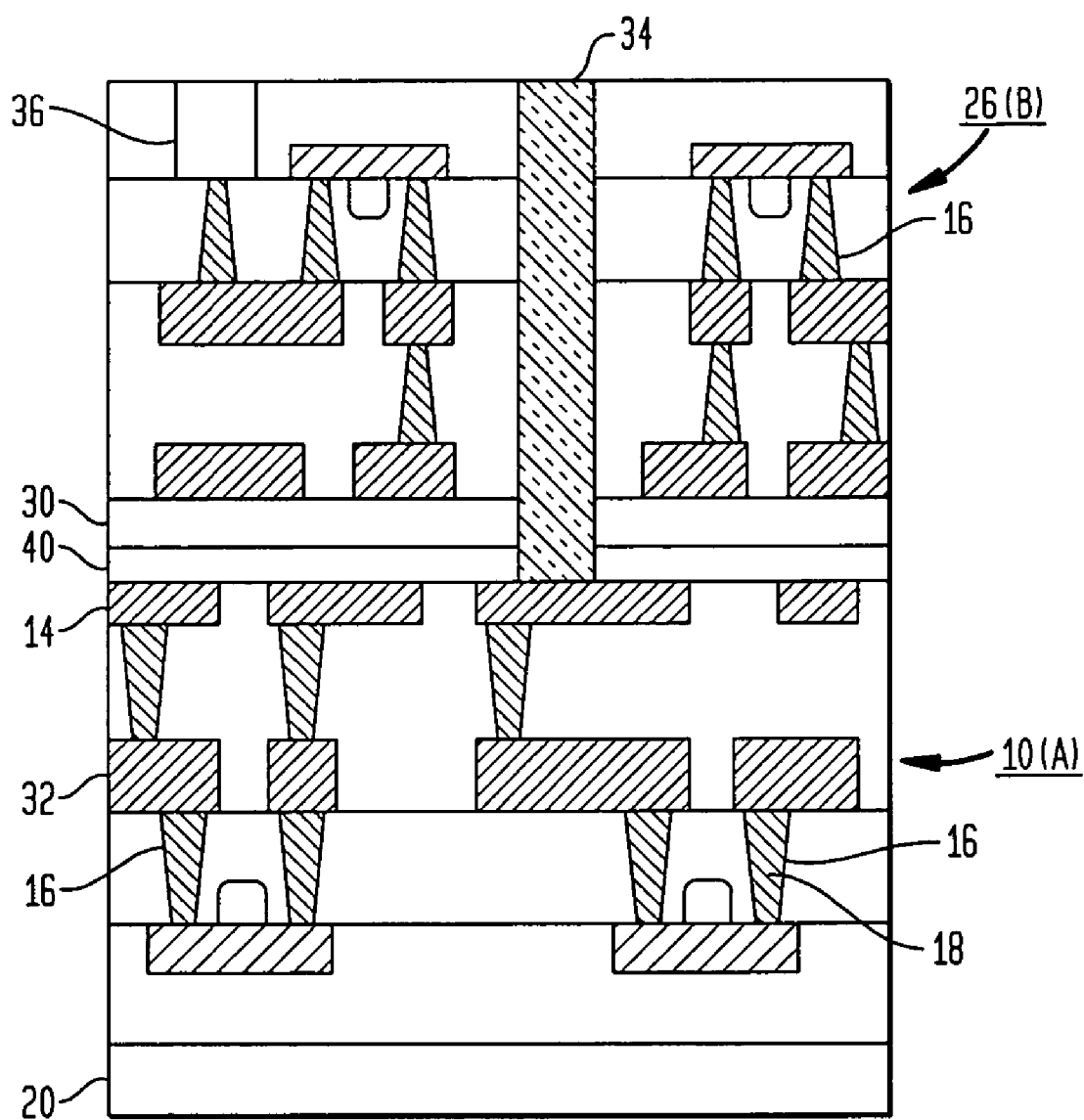
FIG. 5 illustrates a further process step implemented in the sequence of manufacturing the bonded chips which are in a stacked relationship as shown in FIG. 4.

Concerning FIG. 5 of the drawings, the through-via or vias 34 are then filled, as are any through buried oxide layer (BOX) contacts to Chip 26 (Shapes 36) in the event that they had been opened. Furthermore, it may be possible to implement this process by depositing and deep etching a thick liner material, and then plating thereover. A copper fill may be advantageous to provide for electrical conductivity; however, a copper fill may require the liner to be relatively thick, inasmuch as the copper will be penetrating the BOX layer of Chip 26 and thus render it susceptible to metal contamination. ALD processes can be employed for the purpose of depositing diverse materials that are utilized as a plug or seed. Any metal is then removed from the upper surfaces or top of the stack (chips 10 and 26 as superimposed). CMP may be employed to accomplish a cleanup of this upper surface if the upper surface is sufficiently flat. In order to maintain a general plurality or flatness of the upper surface dummy Chips B may be attached to bad Chip A sites, which have been ascertained. This cleanup step may preferably require the use of a dry etch.

FIG. 5 of the drawings illustrates completed bonding of Chip A (Chip 10) and Chip B (Chip 26), with connections enabled to Chip A by filled through-vias 34 and to Chip B by filled contact shapes 36.

Figure 6:
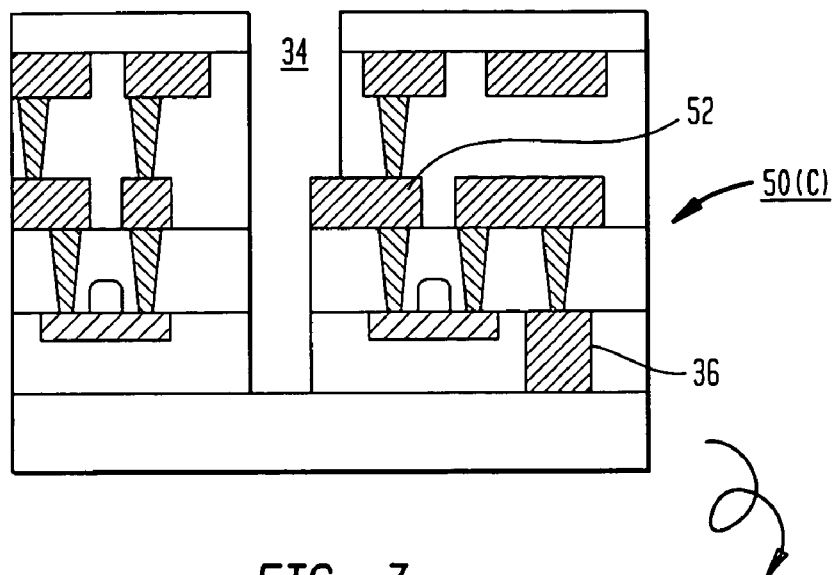
FIG. 6 illustrates a further embodiment comprising a modified semiconductor Chip C utilized in lieu of Chip B, which is adapted to be bonded to base semiconductor Chip A.
Figure 7:
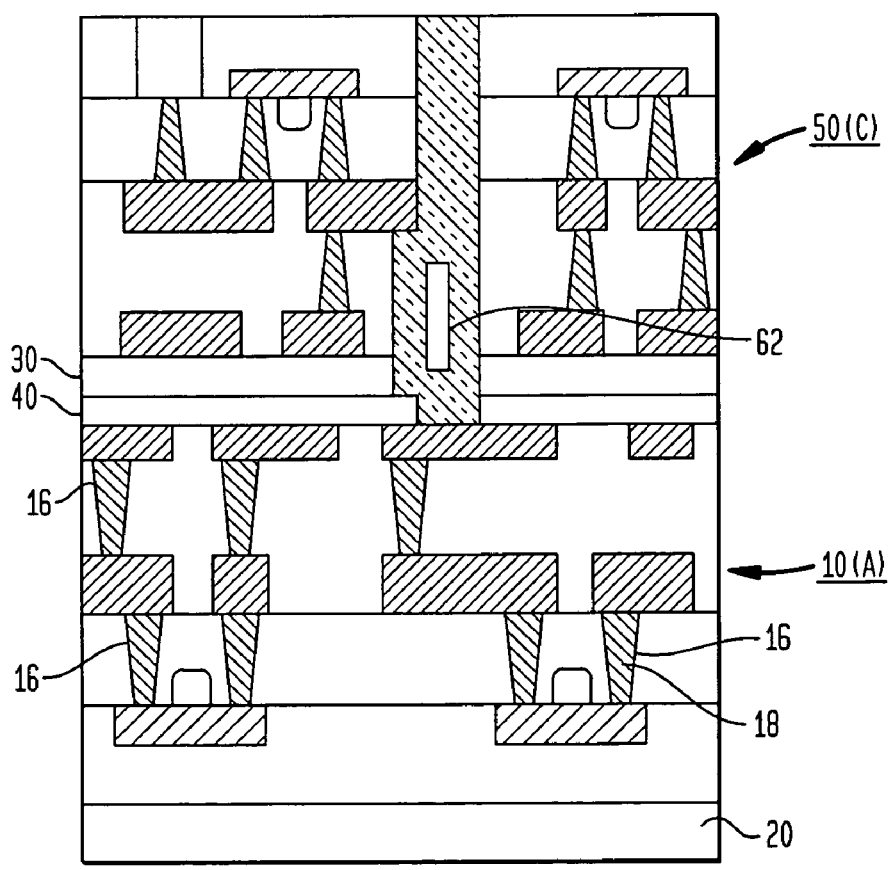
FIG. 7 illustrates the semiconductor chips A and C of FIGS. 1 and 6 in a mutually aligned and bonded relationship pursuant to the invention.

Illustrated in FIG. 6 and FIG. 7 of the drawings is a design where direct contact from a top Chip C (referred to as Chip 50) to base semiconductor Chip A is implemented without necessitating top-side connection of through-vias 34 to contact shapes 36. In this embodiment, as depicted in FIG. 6, through-via 34 is configured so that it overlaps the wiring shape 52 of Chip 50 to which connection is required to base Chip 10. Inasmuch as an etching of through-via 34 is blocked by wiring shape 52, the via profile will be wider at its top than at its bottom.

Chip 50 is then inverted, and bonded to base Chip 10, and the handle substrate is removed from Chip 50 and the bottom of through-via 34 is etched, as mentioned above. Then through-via 34 is lined and filled, and metal overburden removed, similarly as is implemented for the structure shown in FIG. 5 of the drawings. The result of this process is illustrated in FIG. 7 of the drawings. As the wider top portion of through-via 34 has now been moved to the bottom as a consequence of the inversion of Chip 50 prior to bonding, conformal filling of through-via 34 can result in fill void 62.

The chip stacking process can be repeated by attaching additional chips to the top of a stack formed by chips 10 and 26 (A and B) from FIG. 5, or a stack formed by chips 50 and 26 from FIG. 7. Through-vias in these additional chips will need to intersect through-vias 34 or contact shapes 36 of each previous-level chip.

Bonding to the outside of the stacked chips may be implemented by connecting to the exposed filled vias on the top surface of the top chip of the stack and presently may only comprise small cross-sectional via ends. A further step would then be to plate a pad onto the surface, which would be a suitable material to which C4 or a wirebond could be connected. However, instead of plating or employing photolithography and etching to form a pad, it is possible to build chip containing only larger pads and through vias, and then to attach this pad-only chip to the top surface by using an approach similar to that described for two active-circuit chips.

In optional aspects of the invention, an adhesive to provide bonding of the chips 10, 26 and/or 50 can be applied before the printing and/or etching of the through-via 34 on Chip 26 and then patterned with the through-via mask. This sequence in manufacture will assist in avoiding filling the via with adhesive, but represents a limit as to which resist and/or developers can be employed.

Furthermore, top chips (Chip 26 as illustrated) can be comprised of passive components, which upon occasion may be required for package compatibility, superconductors, large capacitors and so forth. Moreover, in the event of employing a polysilicon plug in through-BOX contact shapes 36 to Chip 26, the polysilicon fill can be protected from the handle wafer removal etching by depositing a thin oxide film or coating into the as-etched shape 36 aperture prior to polysilicon deposition. Thereafter, only the thin oxide need be etched off to expose the polysilicon subsequent to removal of the handle layer 28.

In order to provide for a satisfactory manufacture, the chips 10, 26 and 50 (A, B and C) must be of adequately flat construction and the adhesive bonding material sufficiently thick to prevent the formation of any voids in the adhesive during bonding. Chips 10 and 26 (and 50) alignment can be made very satisfactorily, at less than 25 nm, employing a modified lithographic exposure or setup. The location of Chip 10 is determined by looking at the front side thereof, and the same or different optics can be utilized to examine or map the front of Chip 26. Appropriate precision mechanics, such as are employed for stepper stages, may be utilized to move Chip 26 into a proper location and then pressed down onto Chip 10. (This also pertains to Chip 50). Capping film 30 materials may be selected, for example, from candidate material, such as silicon nitrides, such that etching thereof to clear the bottom of the through-vias 34 after bonding does not thin the BOX and STI layer 22 of Chip 26. Moreover, unless something else is required for final pads, all photolithographic processes may be implemented while all chips are still in wafer form, not on individual chips or chip stacks, so that very little special processing is required except the alignment of the Chip 26 to Chip 10 (or Chip 50) and the application of the adhesive bonding material.

Finally, in order to enlarge the upper ends or tops of the through-vias 34, it is possible to overplate the via metal in order to create bumps for improved contact to the metal layers without requiring any photolithography on the stack.

From the foregoing, it becomes readily apparent that the invention improves upon the manufacturing process of providing multi-chip stacks or wafers in a highly efficient and unique mode, providing for a simplified manufacturing sequence and allowing for a greater density of chips of diverse technologies to be positioned on a wafer and ready for stacked relationships forming three-dimensional integrated circuit structures.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. An electronic device including at least two integrated circuit chips or elements in superimposed adherent relationship forming a multi-chip stack; comprising:

a first one of said integrated circuit chips or elements having a multi-layer construction comprising a plurality of dielectric and metal layers, said first chip or element being constituted of a plurality of adhesively-fastened multi-chip integrated circuit stacks, a first surface constituted of a capping layer and an opposite distal surface constituted of a permanent silicon handle layer;

a second one of said integrated circuit chips or elements having a multi-layer construction comprising a plurality of dielectric and metal layers, a first surface constituted of a capping layer, said second integrated circuit chip or element is in an inverted position and adhesively fastened in surface engagement with the capping layer of said first integrated circuit chip or element, said second integrated circuit chip or element having conductor-filled vias that connect conductive layers in said first said integrated circuit chip or element to the top surface of said multi-chip stack, and conductive layers in said second integrated circuit chip or element to the top surface of said multi-chip stack; and said first and second semiconductor chips or elements being adhered to each other through the interposition of an adhesive layer, said adhesive layer comprising a thin adhesive consisting of a maleic anhydride polymer, activated by a dendritic amine binder.

2. A multi-chip stack as claimed in claim 1, wherein said second integrated circuit chip or element is built on a substrate which is removed after adhesive fastening of the two chips or elements.

3. A semiconductor device as claimed in claim 1, wherein said second semiconductor chip or element includes at least one through-via extending from said first chip or element to the top surface, intersecting conductive layers in said second integrated circuit chip or element, so as to provide for access for electrical connections between said metal layers of said at least two chips or elements.

4. A semiconductor device as claimed in claim 3, wherein said at least one through-via formed in said second semiconductor chip or element is filled with an electrically conductive material so as to provide an electrical connection from external circuitry to electrical components of said first and second semiconductor chips or elements, and between electrical components of said first and second semiconductor chips or elements.

5. A semiconductor device as claimed in claim 1, wherein the substrate for said first semiconductor chip or element is selected from the group of materials consisting of Si, SOI, SiGe, GaAs and the like.

6. A semiconductor device as claimed in claim 1, wherein at least a third said semiconductor chip or element is selectively adhesively bonded to said second semiconductor chip or element so as to form a multi-chip stack having further electrical contacts and connecting therewith.

7. A semiconductor device as claimed in claim 1, wherein said second semiconductor chip or element comprises SOI layers.

8. A process of providing an electronic device including at least two integrated circuit chips or elements in superimposed adherent relationship forming a multi-chip stack; said process comprising:
   providing a first one of said integrated circuit chips or elements having a multi-layer construction comprising a plurality of dielectric and metal layers, including forming a first surface constituted of a capping layer and an opposite distal surface constituted of a permanent silicon handle layer;
   providing a second one of said integrated circuit chips or elements having a multi-layer construction comprising a plurality of dielectric and metal layers, said first chip or element being constituted of a plurality of adhesively-fastened multi-chip integrated circuit stacks, including forming a first surface constituted of a capping layer and an opposite distal surface constituted of a handle layer, said second integrated circuit chip or element being arranged in an inverted position and adhesively fastened in surface engagement with the capping layer of said first integrated circuit chip or element, said second integrated circuit chip or element being formed with vias that are filled with conductive material that connects conductive layers in said first said integrated circuit chip or element to the top surface of said multi-chip stack, and conductive layers in said second integrated circuit chip or element to the top surface of said multi-chip stack; and
   adhering said first and second semiconductor chips or elements through the interposition of an adhesive layer, said adhesive layer comprising a thin adhesive consisting of a maleic anhydride polymer, activated by a dendritic amine binder.

9. A process as claimed in claim 8, wherein said second integrated circuit chip or element is built on a substrate which is removed after adhesive fastening of the two chips or elements.

10. A process as claimed in claim 8, wherein said second semiconductor chip or element has at least one through-via formed therein extending from said first chip or element to the top surface, so as to provide for access for electrical connections from external circuitry to electrical components of said first and second semiconductor chips or elements and, between said metal layers of said at least two chips or elements, said through-via having been defined using conventional semiconductor techniques while the said second semiconductor chip or element remained in wafer form.

11. A process as claimed in claim 10, wherein said adhesive layer is etched from the bottom of the said at least one through-via using the unfilled said at least one through-via as an etch mask.

12. A process as claimed in claim 10, wherein said at least one through-via formed in said second semiconductor chip or element is filled with an electrically conductive material so as to provide an electrical connection between electrical components of said first and second semiconductor chips or elements.

13. A process as claimed in claim 8, wherein the substrate for said first semiconductor chip or element is selected from the group of materials consisting of Si, SOI, SiGe, GaAs and the like.

14. A process as claimed in claim 8, wherein at least a third said semiconductor chip or element having layers replicating said first semiconductor chip is selectively adhesively bonded to said second semiconductor chip or element so as to form a multi-chip stack having further electrical contacts and connecting therewith.

15. A process as claimed in claim 8, wherein said second semiconductor chip or element comprises SOI layers.

16. A process as claimed in claim 8, wherein said semiconductor chips or elements are processed and adhesively stacked prior to being sliced from a large-sized semiconductor wafer.

* * * * *